United States Patent
Nguyen et al.

(10) Patent No.: US 6,664,026 B2
(45) Date of Patent: Dec. 16, 2003

(54) METHOD OF MANUFACTURING HIGH ASPECT RATIO PHOTOLITHOGRAPHIC FEATURES

(75) Inventors: Son Van Nguyen, San Jose, CA (US); Neil Leslie Robertson, Palo Alto, CA (US); Thomas Edward Dinan, San Jose, CA (US); Thao Duc Pham, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 09/815,540

(22) Filed: Mar. 22, 2001

(65) Prior Publication Data

US 2002/0136990 A1 Sep. 26, 2002

(51) Int. Cl.$^7$ ............................. G03F 7/00; H01F 41/00
(52) U.S. Cl. ...................... 430/311; 430/313; 430/316; 430/317; 430/318; 438/702; 216/72; 427/249.7
(58) Field of Search .................. 430/313, 316, 430/317, 318; 216/72; 438/702

(56) References Cited

U.S. PATENT DOCUMENTS

| | | | |
|---|---|---|---|
| 4,589,952 A | * 5/1986 | Behringer et al. | 438/702 |
| 5,246,884 A | 9/1993 | Jaso et al. | 437/225 |
| 5,679,269 A | * 10/1997 | Cohen et al. | 216/72 |
| 5,725,573 A | 3/1998 | Dearnaley et al. | 623/2 |
| 5,780,119 A | 7/1998 | Dearnaley et al. | 427/528 |
| 5,985,524 A | 11/1999 | Allen et al. | 430/326 |
| 5,989,693 A | 11/1999 | Yamasaki et al. | 428/216 |
| 6,030,904 A | 2/2000 | Grill et al. | 438/781 |
| 6,156,487 A | * 12/2000 | Jennison et al. | 430/316 |

FOREIGN PATENT DOCUMENTS

JP 62043650 A1 2/1987 ............ G03G/5/08

OTHER PUBLICATIONS

IBM Technical Bulletin Disclosure "Method for Slider Attachment and Head Termination to a Suspension in a Disk File", Feb. 1993, pp. 371–372.

* cited by examiner

Primary Examiner—Mark F. Huff
Assistant Examiner—K Sagar
(74) Attorney, Agent, or Firm—Lewis L. Nunnelley; William D. Gill

(57) ABSTRACT

An etch barrier to be used in a photolithograph process is disclosed. A silicon rich etch barrier is deposited on a substrate using a low energy deposition technique. A diamond like carbon layer is deposited on the silicon rich etch barrier. Photoresist is then placed on this etch barrier DLC combination. To form photolithographic features, successive steps of oxygen and flourine reactive ion etching is used.

14 Claims, 4 Drawing Sheets

METHOD OF MANUFACTURING HIGH ASPECT RATIO PHOTOLITHOGRAPHIC FEATURES

BACKGROUND OF THE INVENTION

1. Field of the Invention

This invention relates to a method of manufacturing photolithographic features which have high aspect ratios. This method is applicable to manufacturing devices such as recording heads for disk drives and semiconductor integrated circuits.

2. Description of the Background Art

Devices which are made with photolithographic processes include articles such as recording heads for disk drives and integrated circuits for a variety of applications. In general there is a trend to make such devices smaller and smaller. The important dimensions of such devices can include for example the track widths of recording heads and conductor widths for integrated circuits.

The conventional photolithographic processes of manufacturing these small features involve first forming a layer of photo resist on a substrate such as metal or silicon. Then a pattern is created in the resist layer by first exposing through a patterned mask with the proper light for that particular resist and then chemically dissolving away the exposed portions of the resist to expose the underlying substrate. The actual structure in the final device is then usually constructed by plating or otherwise building the features onto the substrate. After the feature has been built, the remaining resist layer is removed. This conventional approach is appropriate when the width of the desired features is relatively large compared to the depth or thickness of the resist; or correspondingly, when the width of the features is large relative to the height of the feature. The aspect ratio of a feature is defined as the height of a feature divided by the width. For example, a recording head for very high density applications would have a very narrow track width and the height of the write pole would be large compared to the track width.

When manufacturing high aspect features conventional photolithographic processes have serious shortcomings. Among these shortcomings are lack of precise definition of the desired template in the resist and undercutting when the resist is chemically treated. Both of these shortcomings limit the ability of conventional methods to achieve high aspect ratio features.

An improvement in the conventional processes of achieving high aspect ratio features has been the use of an image transfer process. In this process a thin adhesion layer, typically containing a tantalum rich material is placed on the substrate to provide improved adhesion for the resist layer. A thin top layer of a silicon rich or tantalum rich material is placed on top of the resist layer, and a pattern is created in this top layer. Then, instead of using photolithography with a wet chemical process to dissolve the underlying resist layer, an oxygen based reactive ion etch (RIE) is used to create the template in the resist layer. This method has the advantage of creating more sharply defined walls in the resist template (e.g. little undercutting). However, this approach has at least two noteworthy shortcomings. One, the adhesion layer material which is removed during the RIE process tends to deposit on the walls of the photoresist template. Furthermore, it is difficult to completely remove the remaining adhesion layer without damaging or undesirably altering the patterned substrate.

There is a need for a process which has an effective adhesion layer between the substrate and resist which protects the substrate and is subsequently easy to remove.

SUMMARY OF THE INVENTION

The present invention is a photolithographic process which includes a step of forming an effective etch barrier for an oxygen RIE process. The process results in improved protection of the substrate and more sharply defined goemetrical features. The steps of the process of the present invention include first placing a silicon rich thin layer on the substrate using a low energy deposition. A thin diamond like carbon (DLC) layer is then placed on the silicon rich layer. Relatively thick resist is then placed on the DLC. Finally the image transfer layers comprising a silicon rich or tantalum rich layer and an additional resist layer which is relatively thin are placed on the thicker resist. The DLC layer provides good adhesion with the resist. The silicon rich material on the substrate is the etch barrier which protects the substrate during the oxygen RIE. The silicon rich material is subsequently removed with a fluorine based RIE without damage to the substrate and with minimal redeposition on the walls of the features in the resist layer. These steps allow high aspect ratio photolithographic features to be constructed.

DETAILED DESCRIPTION OF THE INVENTION

Figure 1A:
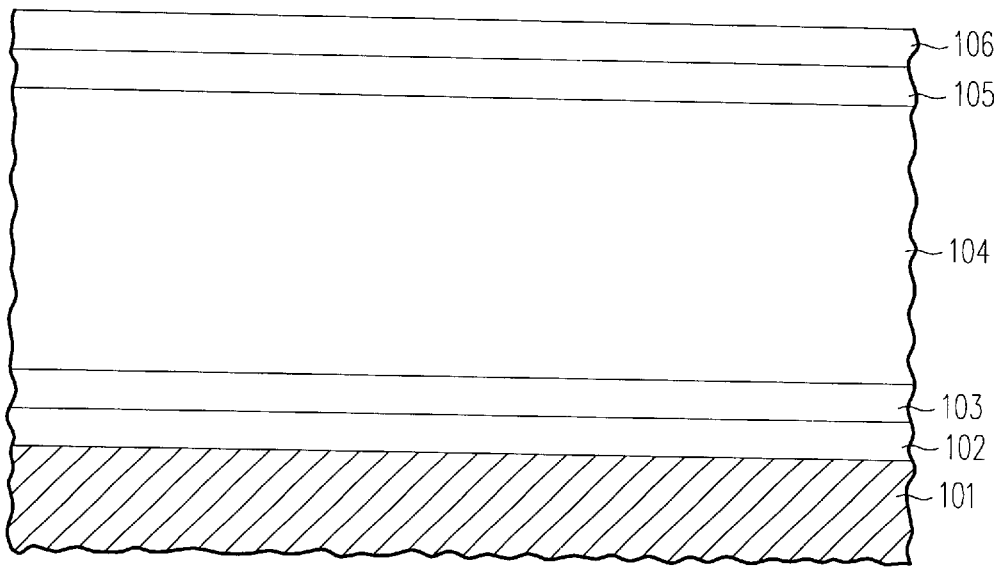
FIG. 1a shows the sequence of layers before the process steps resulting in a resist template.

FIG. 1 shows a series of process steps illustrating the present invention. In FIG. 1a there is shown a sequence of layers formed on the substrate 101. Depending on the device, the substrate could be a substantially pure metal such as Cu or an alloy such as NiFe or CoNiFe. Additionally the substrate could be an amorphous crystalline material used in integrated circuit construction. A first etch barrier layer 102 of Si rich material is then placed on the substrate. This material could be relatively pure Si, but more commonly the material is silicon oxide, silicon nitride, or a combination thereof. This layer is typically in the thickness range of 10 to 40 Angstroms but is not limited to this range. The Si rich etch barrier layer 102 prevents oxygen RIE damage to the substrate. The next layer 103 is composed of diamond like carbon (DLC). This material is hydrogenated carbon which is relatively hard and durable. Typical thickness values for the DLC layer range from 20 to 60 Angstroms. The DLC layer 103 also functions as a very good adhesion layer with the first resist layer 104. The resist layer material is conventional has no special requirements beyond conventional use. The thickness of the first resist layer 104 depends on the desired vertical dimension of the final feature. For example the pole of a magnet recording write head is typically from 1 to 4 um tall. If the desired pole height was 3 um, then the resist thickness would be about 3 um. The relatively thick resist layer 104 is placed on the DLC layer 103. A relatively thin second etch barrier layer 105 is placed on the thick resist layer 104. One of the purposes of this thin layer 105 is to provide an protecting etch barrier to the resist layer 104 during the subsequent oxygen RIE process. Accordingly the material for this layer 105 is typically silicon oxide, silicon nitride, or tantalum oxide. The thickness of this layer 105 is not especially critical and is typically a few hundred Angstroms. Finally a thin layer of conventional resist 106 is placed on the etch barrier layer 105. The thickness of this layer is usually substantially less than one micron.

All of the layers are deposited using well known processes including spin coat, chemical solution deposition, or low energy chemical vapor deposition. It is usually important to form well defined, distinct interfaces between the substrate 101 and the Si rich layer 102 and also between the Si rich layer 102 and the DLC layer 103. Accordingly it is preferable to use lower energy deposition techniques such as chemical vapor deposition rather than a higher energy technique such as ion beam deposition. A technique such as routine ion beam deposition tends to damage the substrate surface and to make the interfaces less distinct. However a lower energy ion beam deposition, where substrate damage is minimal is also acceptable. The subsequent RIE steps leave a cleaner, better defined surface if a low energy process is used for deposition.

Figure 1B:
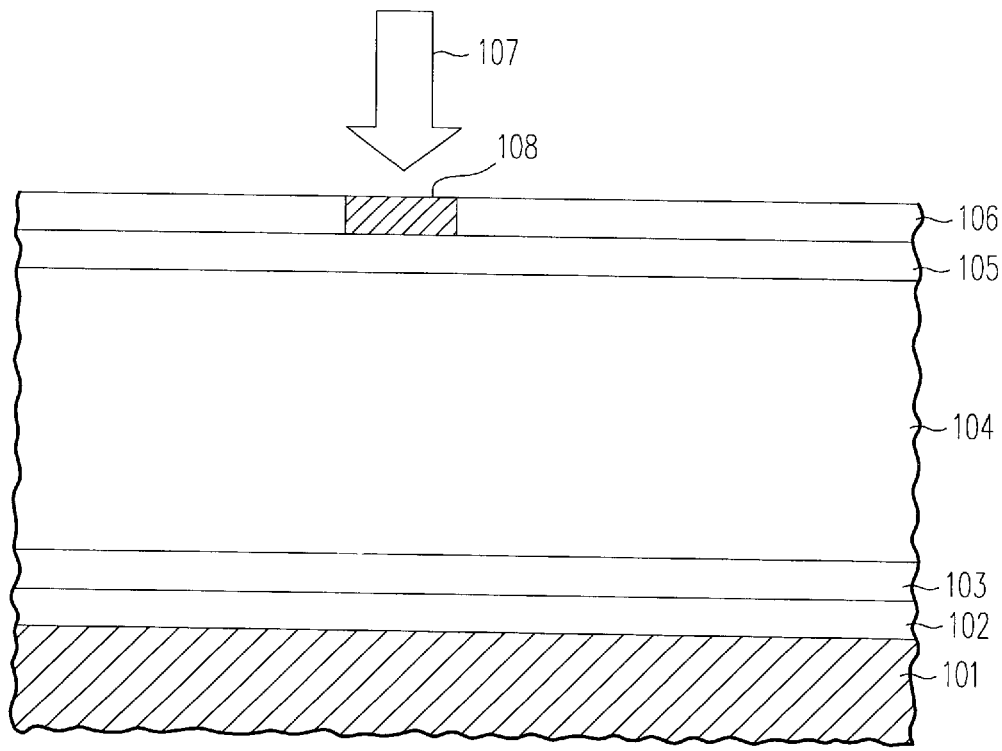
FIG. 1b shows the first step of exposing a portion of the upper, then resist layer 106.
Figure 1C:
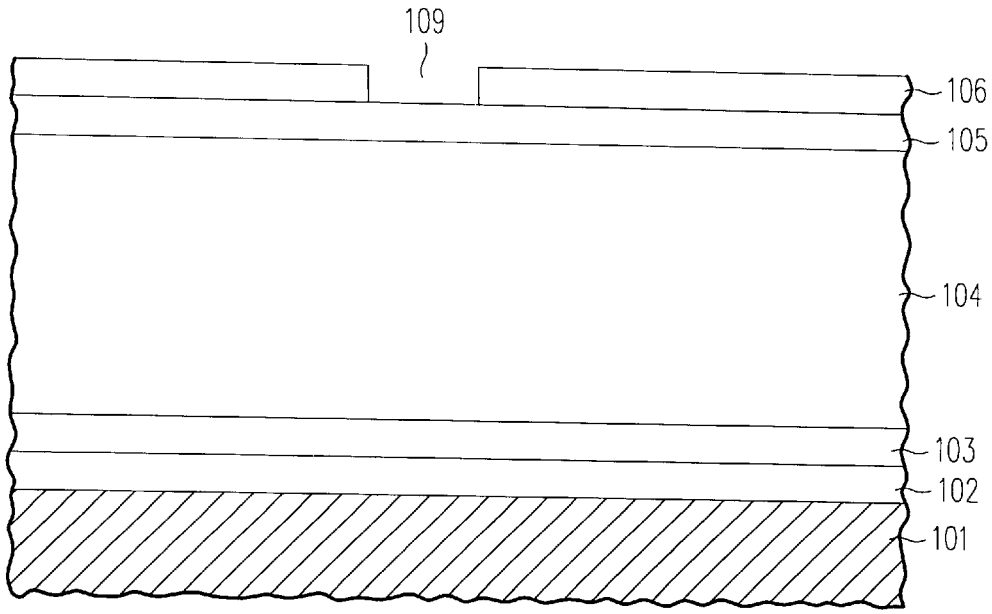
FIG. 1c shows the result of removing the exposed sections of the thin resist layer 106.
Figure 1D:
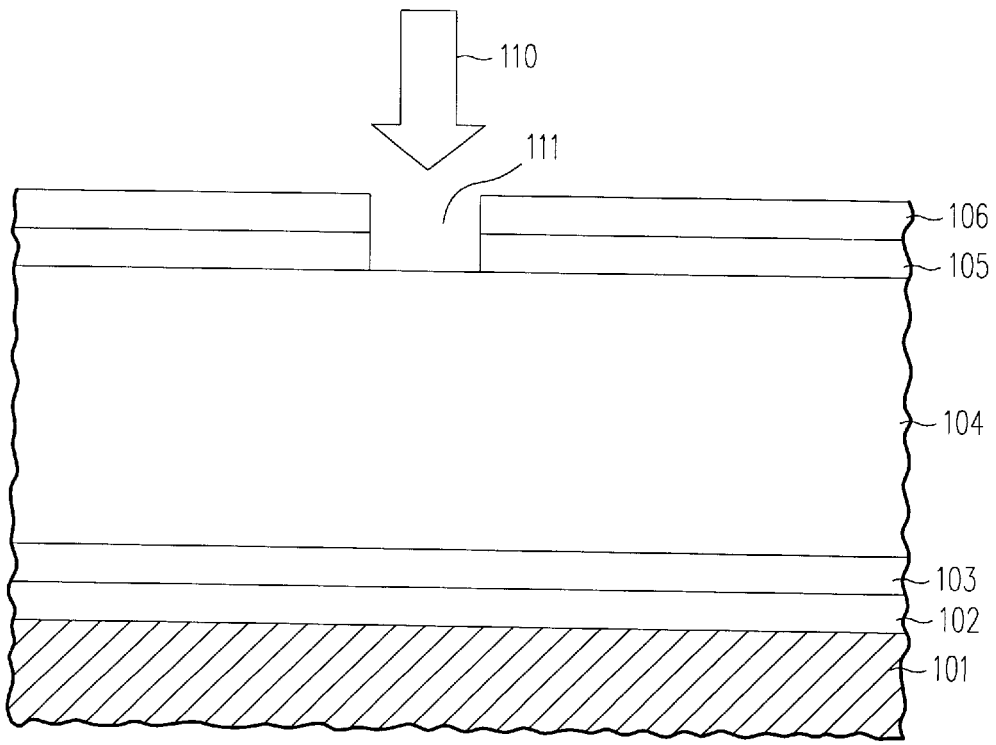
FIG. 1d shows the step of using a fluorine based RIE to transfer the pattern through the etch barrier 105.

After all the layers have been deposited subsequent processing must be carried out to create the desired pattern or template in the resist. FIG. 1b shows the first step of exposing a portion of the upper, thin resist layer 106 to light 107 through a mask to expose some areas of resist 108. This light exposure step is typically done with an optical mask (not shown) which has the desired pattern or image. In FIG. 1c the exposed sections 108 of the thin resist 106 have been removed by developing the resist to leave a pattern 109. FIG. 1d shows the next step of using a fluorine based RIE 110 to transfer the pattern through the etch barrier 105. The pattern 111 is then transfered to the top of the thick resist layer 104. Fluorine based RIE is effective in removing Si materials whereas oxygen based RIE is effective in removing organic material.

Figure 1E:
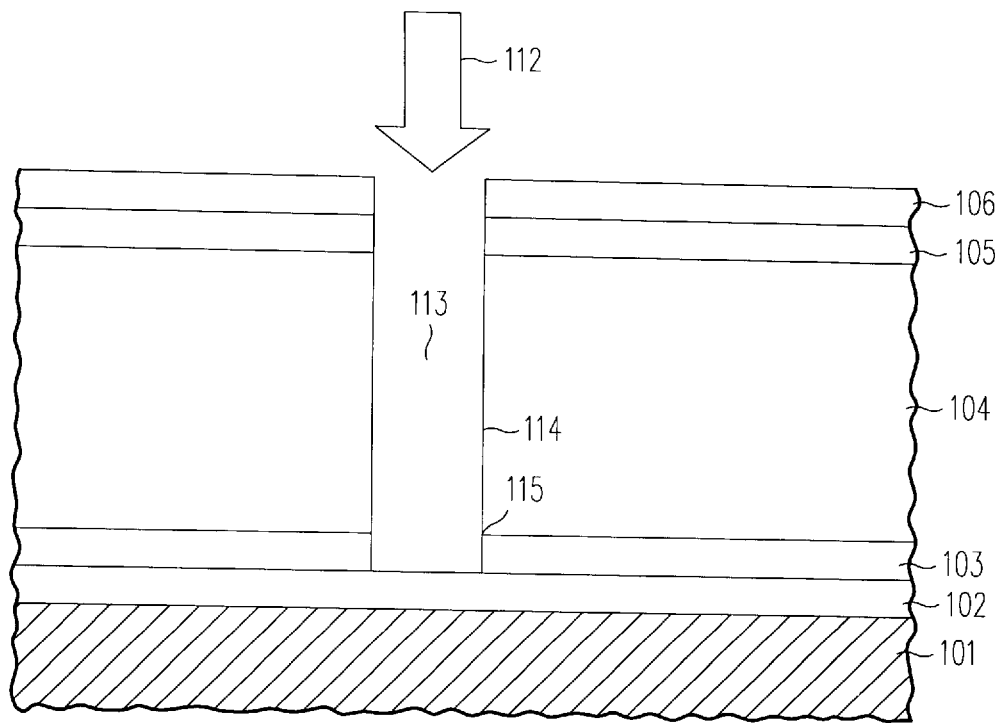
FIG. 1e shows the step of using an oxygen based RIE to transfer the pattern through the resits layer 104 and the DLC layer.
Figure 1F:
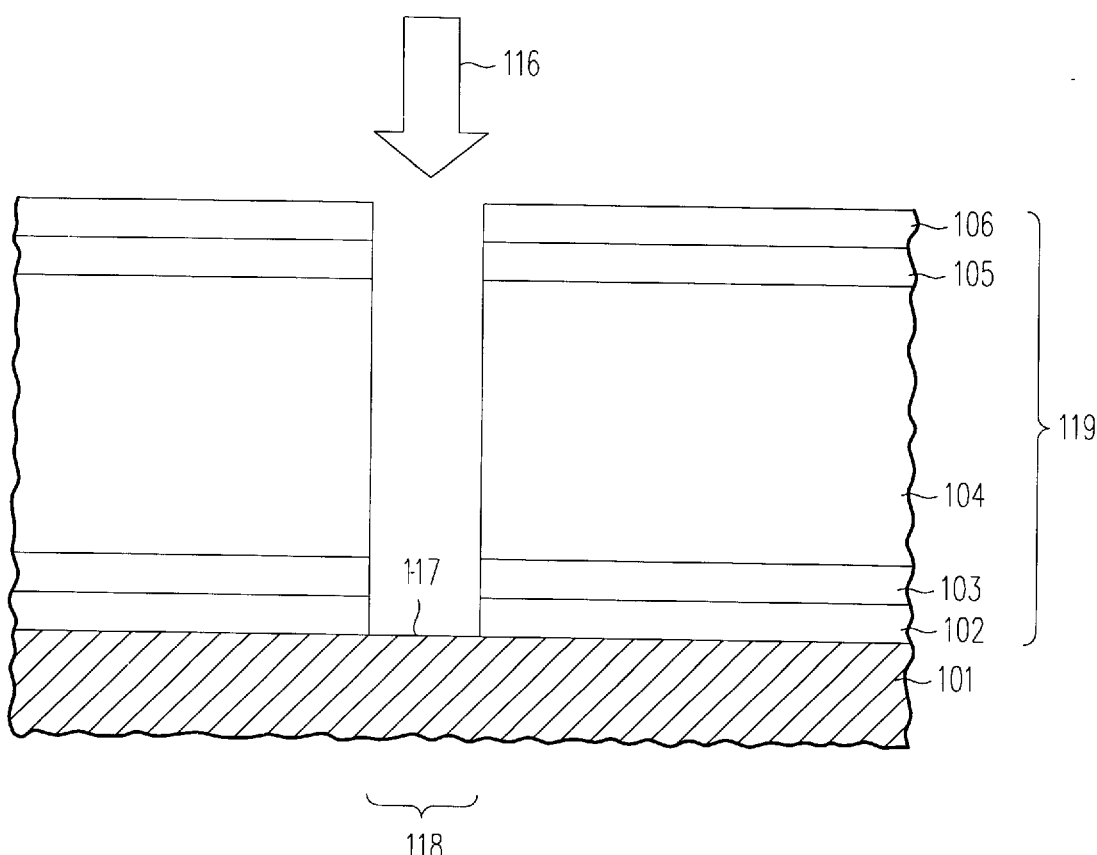
FIG. 1f shows using a flourine based RIE to remove the silicon rich layer 102.

The next step, illustrated in FIG. 1e, is to use an oxygen based RIE 112 to transfer the pattern through the resist layer 104 and the DLC layer 103 in the patterned area 113. This RIE step leaves walls 114 which are much more straight and well defined than by using the conventional chemical processes. The junction between the walls and the bottom layer 115 is also more sharply defined. This enables the construction of a more narrow feature and therefore a feature with a higher aspect ratio. The final step, illustrated in FIG. 1f, is to use a Fluorine based RIE 116 to remove the Si material under the pattern 117 in the silicon rich layer 102. The well defined trenches which form the desired pattern or template are now ready to be filled with the desired material using any of the conventional processes.

Figure 2:
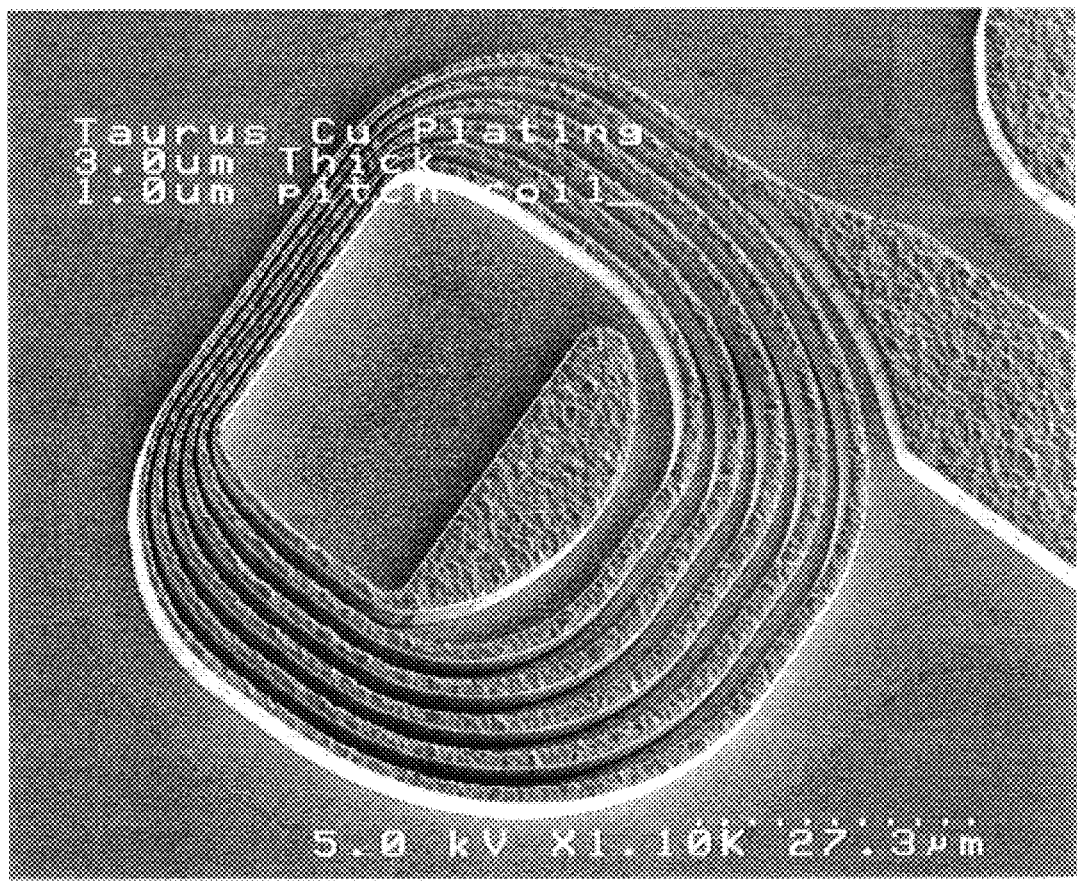
FIG. 2 shows a coil structure of a magnetic recording write head made with the present invention.

FIG. 2 shows an example of a structure made with the invented process. The structure in FIG. 2 is a coil winding for a write head used in magnetic recording. In this case the coil height was about 3 um and was approximately determined by the thickness of the thicker resist 104. The coil width was approximately 0.5 um resulting in an aspect ratio of about 6. This structure demonstrates that the well defined wall geometry and the sharp intersection of the wall and the substrate result in well defined final geometry of the constructed device.

We claim:

1. A process for forming a photolithographically defined feature with high aspect ratios on a substrate, comprising:
    depositing a first etch barrier layer on the substrate;
    depositing an adhesion layer of diamond like carbon (DLC) on said first etch barrier layer;
    depositing a first resist layer on said adhesion layer;
    depositing a second etch barrier layer on said first resist layer;
    depositing a second resist layer on said second etch barrier layer;
    imagewise exposing said second resist layer to light;
    developing the image in said second resist layer;
    transferring the image through the second etch barrier layer using a fluorine RIE;
    transferring the image through the first resist layer and the adhesion layer using an oxygen RIE;
    transferring the image through the first etch barrier layer using a fluorine RIE; and
    depositing material forming the photolithographically defined feature onto the substrate.

2. The process recited in claim 1 wherein said first etch barrier layer comprises substantially pure Si.

3. The process recited in claim 1 wherein said first etch barrier layer comprises silicon oxide.

4. The process in recited claim 1 wherein said first etch barrier layer comprises silicon nitride.

5. The process recited in claim 1 wherein said second etch barrier layer comprises silicon oxide.

6. The process recited in claim 1 wherein said second etch barrier layer comprises tantalum oxide.

7. The process recited in claim 1 wherein said second etch barrier layer comprises silicon nitride.

8. A process for making a photolithographically defined high aspect ratio inductive write coil for a magnetic write head, comprising:
    depositing a first etch barrier layer on a substrate;
    depositing an adhesion layer of diamond like carbon (DLC) on said first etch barrier layer;
    depositing a first resist layer on said adhesion layer;
    depositing a second etch barrier layer on said first resist layer;
    depositing a second resist layer on said second etch barrier layer;
    imagewise exposing said second resist layer to light;
    developing the image in said second resist layer;
    transferring the image through the second etch barrier layer using a fluorine RIE;
    transferring the image through the first resist layer and the adhesion layer using an oxygen RIE;
    transferring the image through the first etch barrier layer using a fluorine RIE; and
    depositing material forming the write coil onto the substrate.

9. The process recited in claim 8 wherein said first etch barrier layer comprises substantially pure Si.

10. The process recited in claim 8 wherein said first etch barrier layer comprises silicon oxide.

11. The process in recited claim 8 wherein said first etch barrier layer comprises silicon nitride.

12. The process recited in claim 8 wherein said second etch barrier layer comprises silicon oxide.

13. The process recited in claim 8 wherein said second etch barrier layer comprises tantalum oxide.

14. The process recited in claim 8 wherein said second etch barrier layer comprises silicon nitride.

* * * * *